United States Patent
Friedman et al.

(10) Patent No.: US 7,245,405 B2
(45) Date of Patent: Jul. 17, 2007

(54) METHOD AND SYSTEM FOR PERFORMING STATELESS COMPRESSION OF MESSAGES

(75) Inventors: Daniel Friedman, Silver Spring, MD (US); Douglas Dillon, Gaithersburg, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 1234 days.

(21) Appl. No.: 10/081,828

(22) Filed: Feb. 21, 2002

(65) Prior Publication Data

US 2002/0149801 A1   Oct. 17, 2002

Related U.S. Application Data

(60) Provisional application No. 60/282,945, filed on Apr. 11, 2001.

(51) Int. Cl.
- H04J 15/00 (2006.01)
- H04J 3/24 (2006.01)
- H04N 1/00 (2006.01)

(52) U.S. Cl. ............. 358/425; 358/426.02; 370/473
(58) Field of Classification Search ............ 358/402, 358/407, 426.13, 426.14, 425, 426.06; 709/236; 370/473

See application file for complete search history.

(56) References Cited

U.S. PATENT DOCUMENTS 5,953,503 A    9/1999  Mitzenmacher et al.
6,388,584 B1*  5/2002  Dorward et al. ............ 341/51
2004/0199660 A1* 10/2004 Liu ............................ 709/236

OTHER PUBLICATIONS

Freytag & Neumann, "Resource Adaptive www Access for Mobile Applications", Computer & Graphics, Vo. 23, 1999, pp. 841-848.
Hannu, Christoffersson & Svanbro, "Robust Generic Message Size Reduction", Network Working Group, http://www.netzmafia.de/rfc/internet-drafts/draft-hannu-rohc-roger-00.txt, Feb. 23, 2001, Sweden.
Database Inspec 'Online! Institute of Electrical Engineers, Stevenage, GB; Banerji et al, "Lossless Compression for Satellite Packet Networks Using the YK Algorithm", Database accession No. 7042446, XP002209266.
Database Inspec 'Online! Institute Of Electrical Engineers, Stevenage, GB; Banerji A. et al, "Applications of YK Algorithm to the Internet Transmission of Web-data: Implementation issues and Modifications", Database accession No. 6590085, XP002209267.
Girardot M. et al, "Millau: An Encoding Format For Efficient Representation And Exchange of SML Over the Web", Computer Networks and ISDN Systems, North Holland Publishing. Amsterdam, NL, vol. 33, No. 106, Jun. 2000, pp. 747-765, XP001005949.

* cited by examiner

Primary Examiner—Kimberly A Williams
(74) Attorney, Agent, or Firm—Bell Boyd & Lloyd LLP

(57) ABSTRACT

An approach for providing stateless compression is disclosed. A message (such as an HTTP (HyperText Transfer Protocol) GET request message or a Domain Name Service (DNS) message) is received from a host. A stateful compressor is initialized with a prescribed sequence to yield a primed state. The message is input into a stateful compressor, which outputs a compressed message based upon the primed state. The stateless compression scheme has particular applicability to networks with high latency—e.g., a satellite network.

27 Claims, 8 Drawing Sheets

METHOD AND SYSTEM FOR PERFORMING STATELESS COMPRESSION OF MESSAGES

RELATED APPLICATIONS

The present application is related to and claims the benefit of the earlier filing date of U.S. Provisional Patent Application 60/282,945, filed on Apr. 11, 2001 and entitled "Primed Compression for Short Messages in Time-Division Multiple-Accessed And/Or Mesh-Communication Systems"; the contents of which are hereby incorporated by reference.

BACKGROUND OF THE INVENTION

1. Field of the Invention

The present invention relates to data compression, and is more particularly related to performing compression to improve network performance.

2. Discussion of the Background

The entrenchment of data networking into modern society, as evidenced by the immense popularity of the Internet, particularly the World Wide Web, has placed ever-growing demands on service providers to continually improve network performance. To meet this challenge, service providers have invested heavily in upgrading their networks to increase system capacity (i.e., bandwidth). In many circumstances, such upgrades may not be feasible economically or the physical constraints of the communication system do not permit simply "upgrading." Accordingly, service providers have also invested in developing techniques to optimize the performance of their networks. One such technique that has received significant industry attention is data compression.

Data compression provides an approach to send more data over a communications channel of a given bandwidth. Specifically, data compression is useful for bandwidth efficiency in bandwidth-constrained networks. Furthermore, compression techniques are attractive to networks that are both bandwidth-constrained and exhibit high latency. In such networks, compression may be essential for providing acceptable performance in certain applications, particularly user-interactive applications. An example of a network that typically exhibits both of these undesirable characteristics, namely constrained bandwidth and high latency, is a satellite network.

Undoubtedly, World Wide Web browsing applications have transformed the manner in which information is exchanged. Because World Wide Web browsing is a highly user-interactive activity, it is desirable to reduce delay experienced by a user between requesting a WWW object (e.g., text, image, etc.) and receiving a response, such as the first portion of the object. The request and delivery of these objects are governed by the HyperText Transfer Protocol (HTTP). Given the highly interactive nature of web browsing, compression of HTTP messages is particularly desirable in a bandwidth-constrained, high-latency network.

Data compression techniques may be described as "stateless" or "stateful." In stateful (or "state-based") compression schemes, the compressor output for a given message depends on the input of prior messages—perhaps even all previous messages. It is observed that with stateful compression, the evolving overall compression ratio (total number of input bytes divided by total number of output bytes) increases asymptotically as more messages are processed. In other words, initial messages undergo comparatively less compression than later messages.

A stateful compression scheme for HTTP request messages in a satellite network has a number of drawbacks. One drawback is that the first message (i.e., request message) does not undergo any significant compression, relative to the amount that later messages are compressed. Consequently, delivery of objects specified by the first request message may be delayed. Another drawback is that decompressing a received compressed message requires successful receipt of earlier messages that are implicitly used by the compression algorithm to produce the received compressed message. This drawback is magnified in a network with mesh connectivity, in that different compressed messages may be sent to each of the connected terminals. If a state-based compression scheme were to be used in such a setting, then a separate compression state must be created and maintained in a sending terminal for each receiving terminal. Similarly, a separate compression state must be created and maintained in a receiving terminal for each terminal which sends to that receiving terminal. Hence, considerable memory may be required in a terminal for maintaining the compression states associated with multiple peer terminals.

Under a stateless compression scheme, each input message may be compressed and decompressed without regard to any other messages. However, conventional stateless compression schemes provide poor compression gains with respect to stateful compression schemes.

Furthermore, satellite networks commonly employ reservation procedures to secure bandwidth for transmission. Reservation procedures entail additional delay, which exacerbates response time for user-interactive applications. In some systems, however, such reservations procedures are not required for transmitting short messages. Accordingly, data compression techniques are desirable to convert messages to a form suitable for transmission as short messages, without reservation procedures.

Based on the foregoing, there is a clear need for improved approaches to performing data compression. There is also a need to implement a compression scheme that enhances scalability. There is a further need to provide data compression that efficiently utilizes resources of a high-latency network. Therefore, an approach for enhancing network performance using an effective compression scheme is highly desirable.

SUMMARY OF THE INVENTION

The present invention addresses the above stated needs by providing a stateless compression scheme to enhance network performance. A priming sequence, which may include actual messages (e.g., HTTP GET messages, Domain Name Service (DNS) messages, etc.), is used to initialize a stateful compressor. The primed state information may be stored to minimize processing delay. Subsequent messages are compressed in a stateless fashion based upon the stored primed state. The compression gain using this technique advantageously permits transmission of the message over a single transmission slot (assuming a time division multiple access (TDMA) scheme). Accordingly, in the case of a bandwidth-constrained, high-latency network (e.g., satellite network), the system resources are used efficiently, while providing reduced user response time. Furthermore, this approach reduces or eliminates the use of reservation procedures, thereby also providing reduced user response time.

According to one aspect of the invention, a method for providing stateless compression is disclosed. The method includes receiving a message from a host. The method also includes initializing a stateful compressor with a prescribed sequence to yield a primed state. The message is input into the stateful compressor. The stateful compressor outputs a compressed message based upon the primed state.

According to another aspect of the invention, a network device for providing stateless compression is disclosed. The device includes a communications interface that is configured to receive a message from a host. In addition, the device includes logic that is configured to perform stateful compression, wherein a primed state of the logic is set using a prescribed sequence. The logic outputs a compressed message based upon the primed state.

According to one aspect of the invention, a communication system includes an originating network element that is configured to receive a message from a host. The network element is also configured to perform stateless compression using a stateful compression scheme, wherein a primed state of the stateful compression scheme is set using a prescribed sequence. The network element outputs a compressed message based upon the primed state. Additionally, the system includes a destination network element communicating with the originating network element over a data network. The destination network element is configured to decompress the compressed message.

According to another aspect of the invention, a network device for providing stateless compression is disclosed. The device includes means for receiving a message from a host, and means for initializing a stateful compressor with a prescribed sequence to yield a primed state. The message is input into the stateful compressor; the stateful compressor outputs a compressed message based upon the primed state.

According to yet another aspect of the invention, a computer-readable medium carrying one or more sequences of one or more instructions for providing stateless compression is disclosed. The one or more sequences of one or more instructions include instructions which, when executed by one or more processors, cause the one or more processors to perform the step of storing a message received from a host. Another step includes initializing a stateful compressor with a prescribed sequence to yield a primed state. The message is input into the stateful compressor; the stateful compressor outputs a compressed message based upon the primed state.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

In the following description, for the purposes of explanation, specific details are set forth in order to provide a thorough understanding of the invention. However, it will be apparent that the invention may be practiced without these specific details. In some instances, well-known structures and devices are depicted in block diagram form in order to avoid unnecessarily obscuring the invention.

Although the present invention is discussed with respect to a satellite communication system and HyperText Transfer Protocol (HTTP), the present invention has applicability to other wide area networks and protocols.

Figure 1:
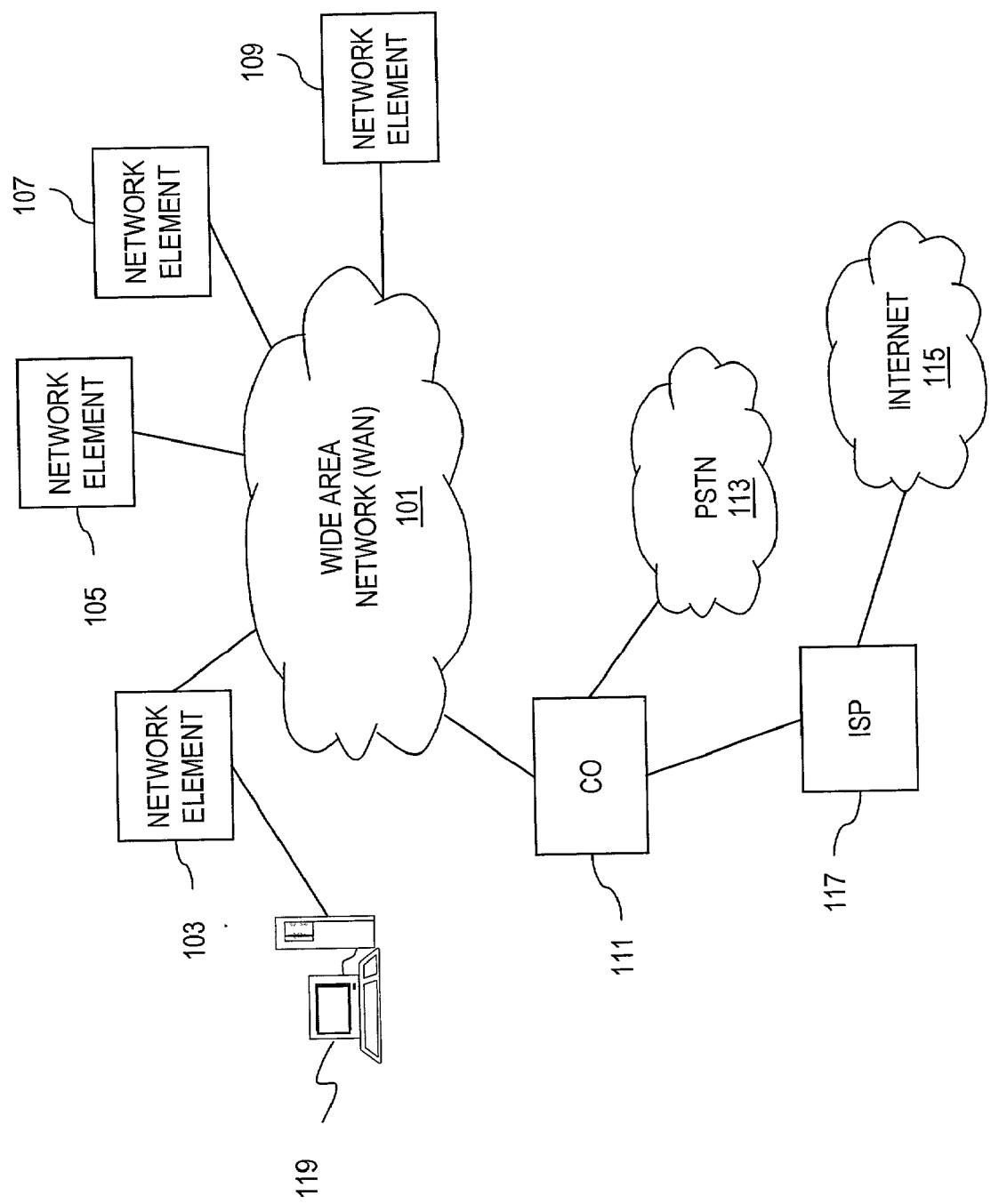
FIG. 1 is a diagram of a communication system capable of utilizing a stateless compression scheme, according to an embodiment of the present invention.

FIG. 1 shows a diagram of a communication system capable of utilizing a stateless compression scheme, according to an embodiment of the present invention. A wide area network (WAN) 101, in an exemplary embodiment, is maintained by a service provider (e.g., carrier); the network 101 provides connectivity for a number of network elements 103, 105, 107, 109 to a central office (CO) 111. The network elements 103, 105, 107, 109 may be any type of networking device with the capability to communicate with the WAN 101, such as a router, bridge, etc. The CO 111 provides access to the public switched telephone network (PSTN) 113. In this example, the CO 111 relays traffic from the PSTN 113 as well as the Internet 115, to which the CO 111 is connected via an Internet Service Provider (ISP) 117.

It is noted that the WAN 101 may be any type of network, such as a radio communication system (e.g., a digital cellular network, a packet radio network, a microwave network, etc.) or a terrestrial network (e.g., an Asynchronous Transfer Mode (ATM) network, frame relay network, etc.). As will be discussed latter, the network elements 103, 105, 107, 109 possess compression logic (not shown) that permits stateless compression of messages, which are then forwarded across the WAN 101 to a destination network element. Further, the WAN 101 may utilize any number of topologies—e.g., a fully meshed topology (i.e., connectivity).

By way of example, a host 119 is attached to the network element 103 and is loaded with a Web browser. As a user navigates around the World Wide Web, the host 119 issues HTTP messages to the network element 103. In turn, the network element 103 compresses these messages for transfer over the WAN 101; in this manner, the bandwidth of the WAN 101 is used efficiently. The operation of the stateless compression scheme is more fully described with respect to FIGS. 4, 5A, and 5B.

Figure 2:
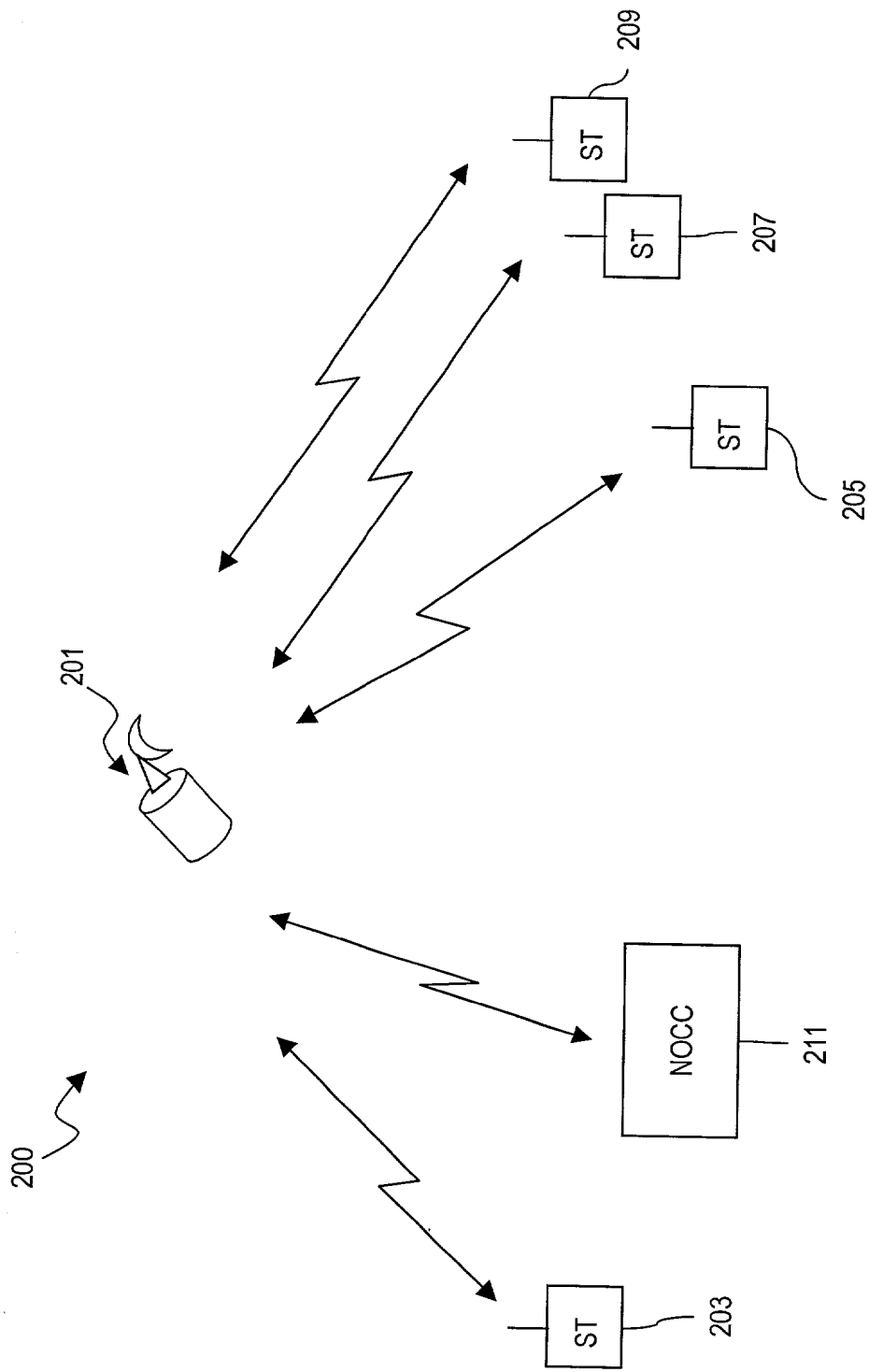
FIG. 2 is a diagram of a satellite communication system whereby system performance is improved using a stateless compression scheme, in accordance with an embodiment of the present invention.

FIG. 2 shows a diagram of a satellite communication system whereby system performance is improved using a stateless compression scheme, in accordance with an embodiment of the present invention. In particular, the system of FIG. 2 illustrates a specific implementation of the system of FIG. 1, in which the WAN 101 is a satellite network and the network elements 103, 105, 107, 109 are in form of satellite terminals. A communication system 200 includes a satellite 201 that supports communication among satellite terminals (STs) 203, 205, 207, and 209. System 200 employs a Network Operations Control Center (NOCC) 209 to manage and control communication services and operations. For example, the NOCC 209 provisions and identifies the channels that are to be allocated.

In an exemplary embodiment, the STs 203, 205, 207, and 209 are Very Small Aperture (VSAT) terminals. Under this architecture, users can communicate from one VSAT ST to another directly with one satellite hop. That is, the system 200 provides mesh connectivity.

Satellite 201 contains a fast packet switch (FPS) (not shown) to process data packets that are exchanged across system 200. Exemplary switches include an ATM (Asynchronous Transfer Mode) switch, and a Gigabit Ethernet switch; it is recognized by one of ordinary skill in the art that any type of switch can be utilized. The FPS transfers the packets that the payload of the satellite 201 receives on the uplinks to the proper downlinks. The payloads of satellite 201 may include other components, such as uplink antenna, down-converters, switch matrix, demodulator banks, and phased-array downlink antenna; these other components are well known, and thus, are not described in detail.

Unlike conventional bent-pipe satellite systems, satellite 201 demodulates fixed-length packets that are received from STs on uplink spot beams, queues the packets for the proper downlink destination based on packet header information, and then modulates the packets for transmission on the specified downlink spot beam. Satellite 201 employs spot beams and possesses processing functions that permit greater power and spectral efficiency than traditional bent-pipe satellites. Further, satellite 201 can replicate individual packets that are received on the uplink and send these packets to multiple downlink spot beam destinations. In this manner, satellite 201 can retain broad distribution capabilities of the bent-pipe satellite systems, while providing flexibility in terms of bandwidth allocations.

The satellite 201 performs the necessary bandwidth control functions, in conjunction with the NOCC 211. In system 200, STs 203, 205, 207, and 209 originate traffic from a particular coverage area and may exchange data among the other STs. The generated traffic from these STs 203, 205, 207, and 209 is transferred through the FPS and terminates at destination STs (not shown) within the same and/or different coverage area. That is, the destination STs can be within the same coverage area as the originating STs. To effectively transmit traffic to the desired destination ST through the switch of the satellite 201, STs 203, 205, 207, and 209 transmit bandwidth requests to the satellite 201 prior to transmitting any data traffic.

A connection that is established between a source ST and a destination ST is controlled by the satellite 201 and the NOCC 211. The NOCC 211, which is based on the ground, provides management functions for the system 200. For example, an ST needs to obtain authorization from the NOCC 211 before making a request to the satellite 201. The NOCC 211 keeps track of the total uplink (and downlink) bandwidth available for connections and will block a connection request if there is insufficient satellite capacity available to satisfy the request.

The satellite 201 implements the bandwidth control function, which includes controlling the allocation of uplink channels and timeslots and mitigating downlink congestion. Satellite 201 examines the requested bandwidth and replies with grants based on downlink resource availability. In an exemplary embodiment, TDMA (Time Division Multiple Access)/FDMA (Frequency Division Multiple Access) uplink channels carry traffic that is regulated by request/grant bandwidth control processes.

Figure 3:
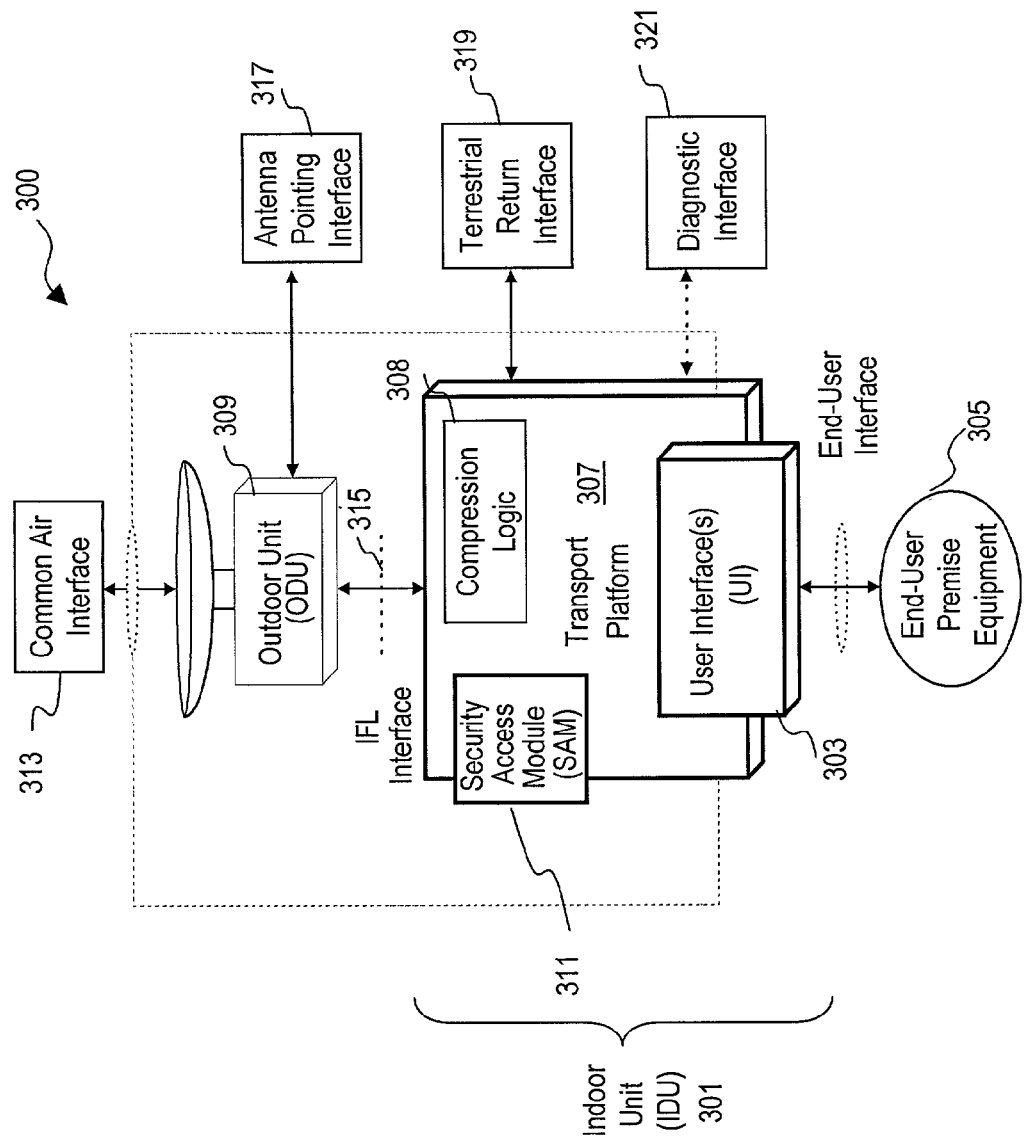
FIG. 3 is a block diagram of a Satellite Terminal (ST) having compression logic, according to an embodiment of the present invention.

FIG. 3 shows a block diagram of a Satellite Terminal (ST) utilized in the system of FIG. 2. The ST 300 includes the following components: an Indoor Unit (IDU) 301, an Outdoor Unit (ODU) 309, a Security Access Module (SAM) 311, and User Interface (UI) 303. As used herein, the terms "user interface" and "user network interface" are used synonymously. In an exemplary embodiment, the IDU 301 unit is installed indoors and may include such components (not shown) as an uplink modulator, downlink demodulator, data packet handler, terminal control subsystem, power supply and chassis. The ODU 309, which is installed outdoors, includes a small antenna, antenna feed, RF (radio frequency) transmitter, high power amplifier (HPA), and IF (Intermediate Frequency) conversion functions.

ST 300 has a layered functional architecture, which includes two functional elements: a core Transport Platform (TP) 307 and one or more User Interfaces (UI) 303. These UIs 303 may be application specific. The TP 307 is the functional element that provides the basic communications services including the physical, network and management layers. Notably, according to an embodiment of the present invention, the TP 307 utilizes a compression logic 308, which provides stateless compression using a stateful compressor (not shown) with a primed state that is derived using a priming sequence (as described below). This compression logic 308 enables a more efficient treatment of data packets, particularly in the case of HTTP GET messages or Domain Name Service (DNS) messages. In this manner, the terminal 300 optimizes the use of bandwidth of system 200.

The TP 307 is generic in the sense that diverse end user applications can be accommodated without change to the TP 307. The UI 303 is the functional element that provides the interface between the TP 307 and an end user equipment 305. The UI unit 303 provides the user interface and adaptation function that allows users to connect the End-User premise equipment 305 to the system 200. The UI 303 may be implemented as a plug in module or be built into the IDU 301, depending on the ST type. Thus, the UI 303 provides any adaptation necessary such that the end user applications can be communicated over system 200.

The SAM unit 311 provides security functions, including authentication, network access control, key management and network signaling encryption. In an exemplary embodiment, the SAM 311 is a replaceable module that is installed as part of the IDU 301.

Further, ST 300 has a number of interfaces: a Common Air Interface (CAI) 313, an Inter-Facility Link (IFL) 315, an Antenna Pointing Interface 317, a Terrestrial Return Interface 319, a Diagnostic Interface 321, and UI 303. ST 300 complies with the common air interface 313, which includes all aspects of the physical, link, network and management layers that defines the interface between the ST 300 and the system 200. The inter facility link (IFL) 315 is an internal interface that connects the IDU 301 and ODU 309. The IFL 315, according to an exemplary embodiment, consists of standard coaxial cables.

The user interface 303 defines the nature of a specific application process and the manner by which the application is adapted to system 200. According to an embodiment of the present invention, the UI 303 is an Ethernet interface (e.g., 10BaseT, 100BaseT, etc.). It is recognized by one of ordinary skill in the art that any number of user interfaces may be utilized.

The antenna pointing interface 317 permits the end-user to steer the antenna towards satellite 201 to obtain proper signal strength. That is, the ST 300 provides an indicator that is accessible at the ODU 309 for use in pointing the antenna to the proper satellite 201. The pointing indicator provides feedback that reflects the relative received signal quality; the antenna position is adjusted until the peak signal quality is achieved.

Via the Terrestrial Return Interface 319, ST 300 supports a terrestrial return capability for terminals that do not have satellite transmission capability. This interface 319 may use, for example, an internal dial-up modem that supports various data rates (e.g., up to 56 kbps), along with the necessary interface logic to connect to a public switched telephone network (PSTN).

Diagnostic interface 321 is used for field service application, such as testing by the field technician. The end-user does not have access to this interface 321, which is protected against unauthorized usage. This interface 321, in an exemplary embodiment, may be an asynchronous serial port, which may support a variety of data rates.

ST 300 may be implemented according to many different ST types, based upon the particular application: End-User Satellite Terminals (ESTs), Network Satellite Terminals (NSTs), and System Satellite Terminals (SSTs). ESTs are complete terminals with all the necessary interworking functions to interface with End-User Premises Equipment 305 (e.g., an individual personal computer or a business local area network (LAN)). STs may also be NSTs, which are complete terminals with all the necessary interworking functions to interface with the network infrastructure of, for instance, an enterprise customer (e.g. network access nodes for Internet backbone), as discussed in FIG. 2. NSTs are well suited to large businesses, corporate headquarters, and Internet Services Provider (ISP) applications. The NOCC 211 also uses SSTs for internal network operations and management. As used herein, the term "ST" refers to any one of the above ST types.

Figure 4:
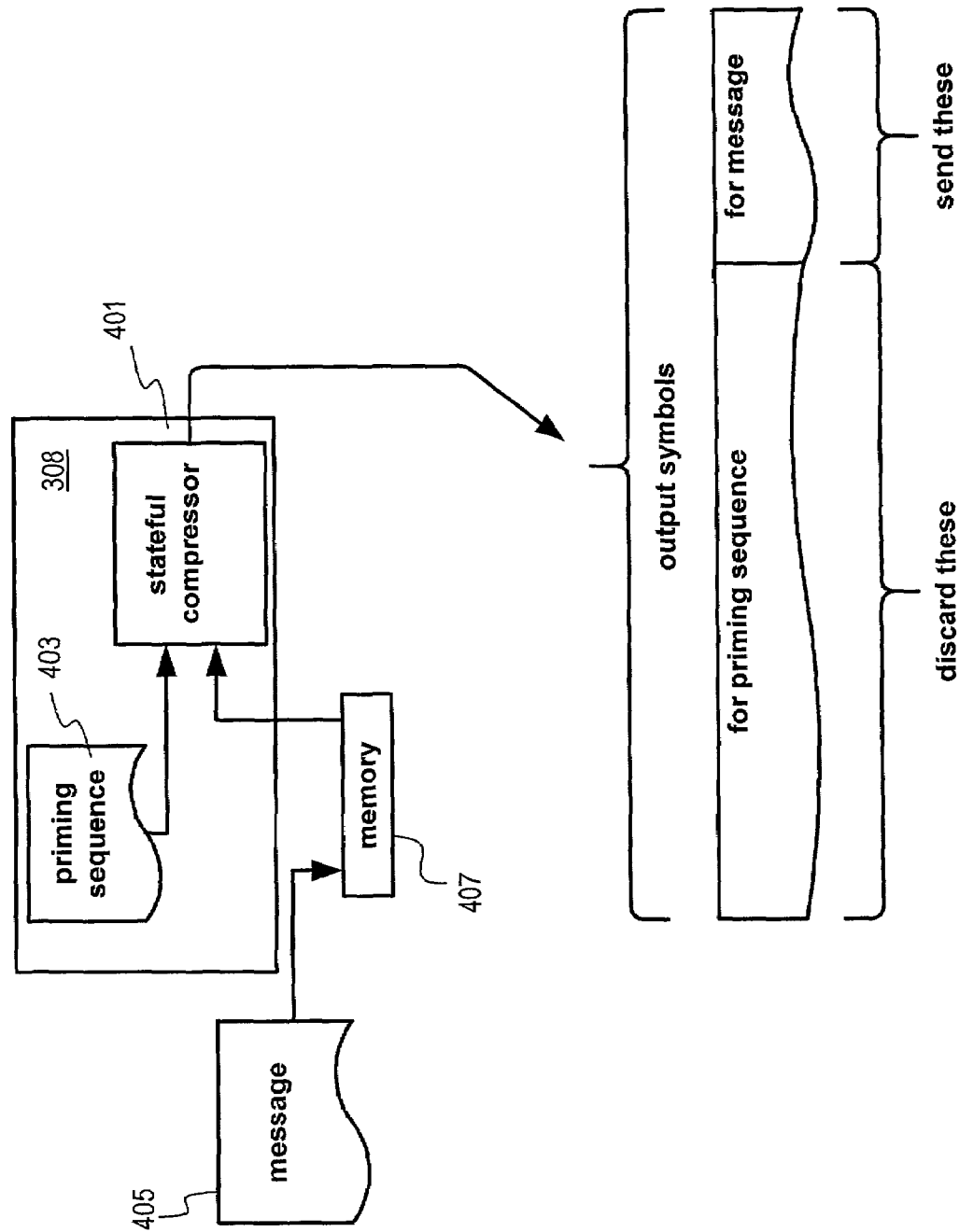
FIG. 4 is a block diagram showing the operation of a stateless compression logic, in accordance with an embodiment of the present invention.

FIG. 4 is a block diagram showing the operation of a stateless compression logic, in accordance with an embodiment of the present invention. As seen in the figure, the compression logic 308 includes a stateful compressor 401 that accepts a priming sequence 403 along with a message 405 that has been retrieved from memory 407. The stateful compressor 401, in turn, outputs symbols that are related to the priming sequence and the message. The output symbols associated with the priming sequence 403 are discarded, while the symbols representing the message 405 are transmitted. The details of the operation of the stateless compression logic 308 are described in FIGS. 5 and 6.

Figure 5:
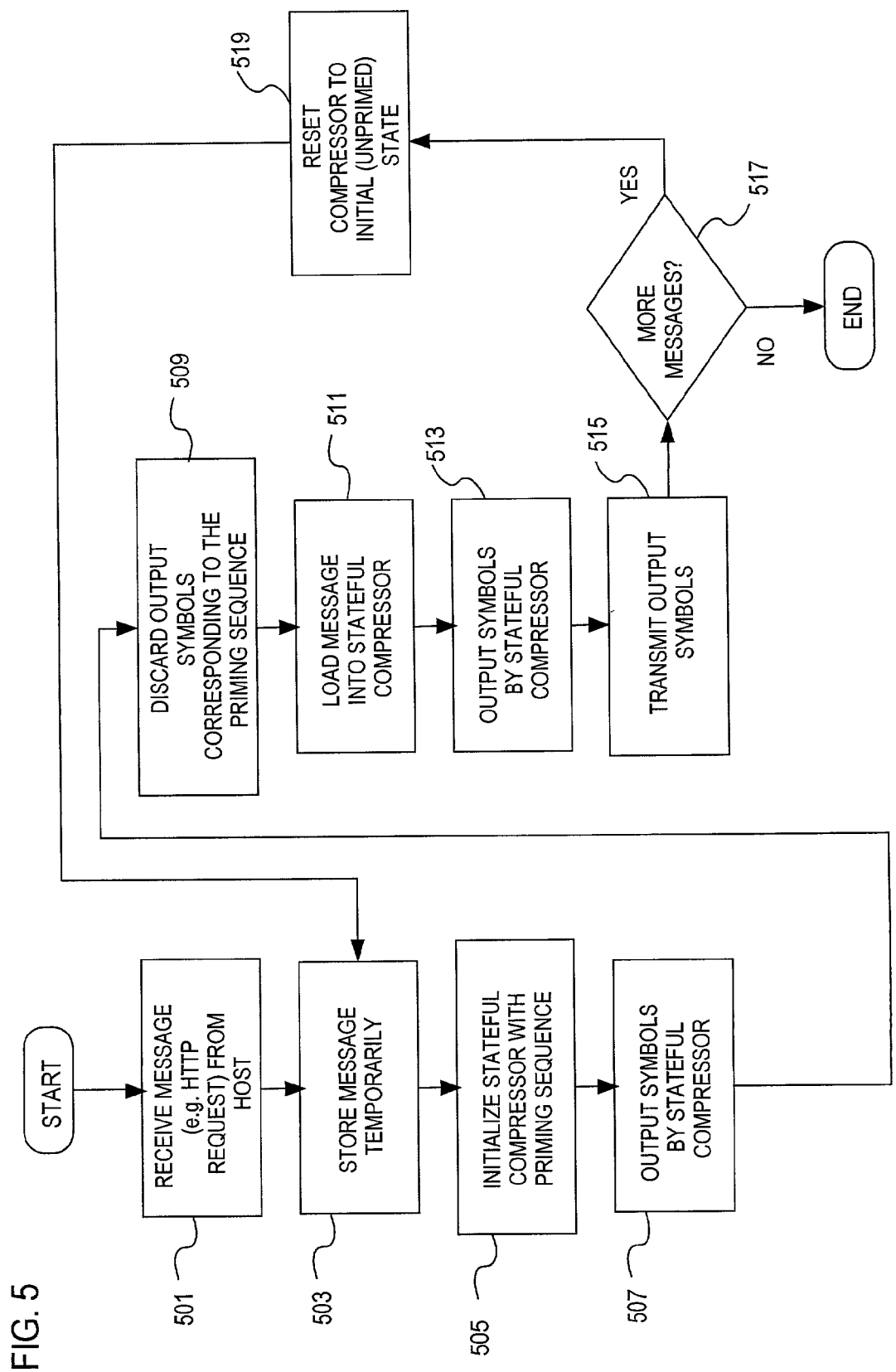
FIG. 5 is a flowchart of a stateless compression scheme, according to an embodiment of the present invention.

FIG. 5 shows a flowchart for a stateless compression scheme, according to an embodiment of the present invention. In essence, a priming sequence is used to set an initial state in a stateful compressor 401 to yield fewer output symbols after processing the submitted message than would be generated otherwise. For the purposes of explanation, it is assumed that the compression logic 308 is implemented in a satellite terminal 300; however, it is recognized that the compression logic 308 may exist in any type of network element in the form of software, firmware, and/or hardware. In step 501, a message 405 (e.g., HTTP request message) is transmitted by the host 119 to the ST 300. The message 405 is then stored temporarily in memory 407, per step 503. Next, in step 505, the stateful compressor 401 is initialized with a priming sequence. In an exemplary embodiment, a number of similar HTTP request messages may serve as a "priming sequence" and are fed into a stateful compressor 401. The priming sequence may be developed to achieve a compression ratio for the actual HTTP request message processed that is acceptably close to an ultimate, asymptotic value, which would be achieved by compressing many messages beforehand. Alternatively, the priming sequence can be other actual HTTP request messages. The priming sequence sets the stateful compressor 401 into a particular "primed" state.

In step 507, the compressor discharges symbols generated by the inputted priming sequence. These symbols are discarded, per step 509. Next, in step 511, the message stored earlier, per step 503, is loaded into the compressor to yield output symbols, per step 513. These output symbols are transmitted, per step 515.

In step 517, the compression logic 308 determines whether more messages are to be compressed. When the stateful compressor receives a subsequent message, the compression process starts afresh, with no regard to any message processed earlier. This entails resetting the compressor to its initial, or "unprimed", state, per step 519. The new message is stored per step 503 and symbols representing the compressed message are developed and transmitted per steps 505, 507, 509, 511, 513, and 515, as described above. If there are no more messages to process, then the process ends. In this fashion, each message to be compressed is processed by the compression logic 308 independently of prior messages. That is, no state is retained in the compression logic 308 from one inputted message to another.

As regards decompression of the compressed messages, the decompressor is aware of the compressor's primed state established by the priming sequence. The priming sequence need not be sent to the corresponding peer terminal since the sequence is the same for all actual messages processed and so can be incorporated in the decompressor design. Accordingly, the decompressor can, upon receipt of only the compressor output symbols associated with a message, decompress and recover the original message. As the compressor described above need retain no state information from one inputted message to another, so, too, the decompressor need retain no state information from one inputted compressed message to another.

Figure 6A:
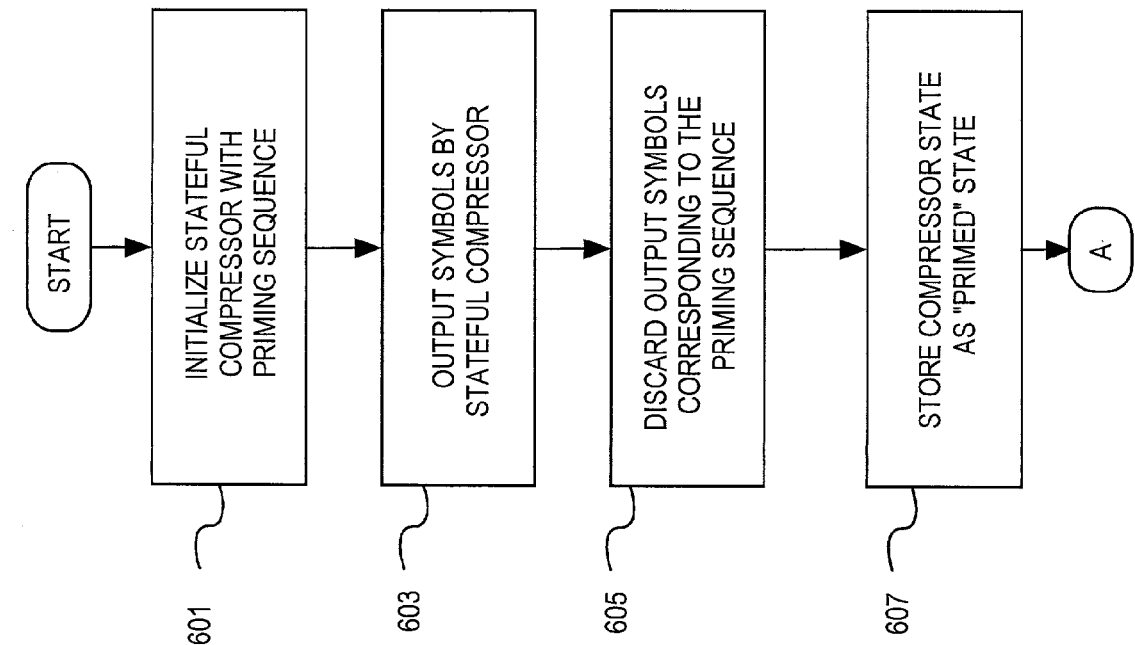
FIGS. 6A and 6B is a flowchart of a process for storing a compressor state and compressing messages, according to an embodiment of the present invention.
Figure 6B:
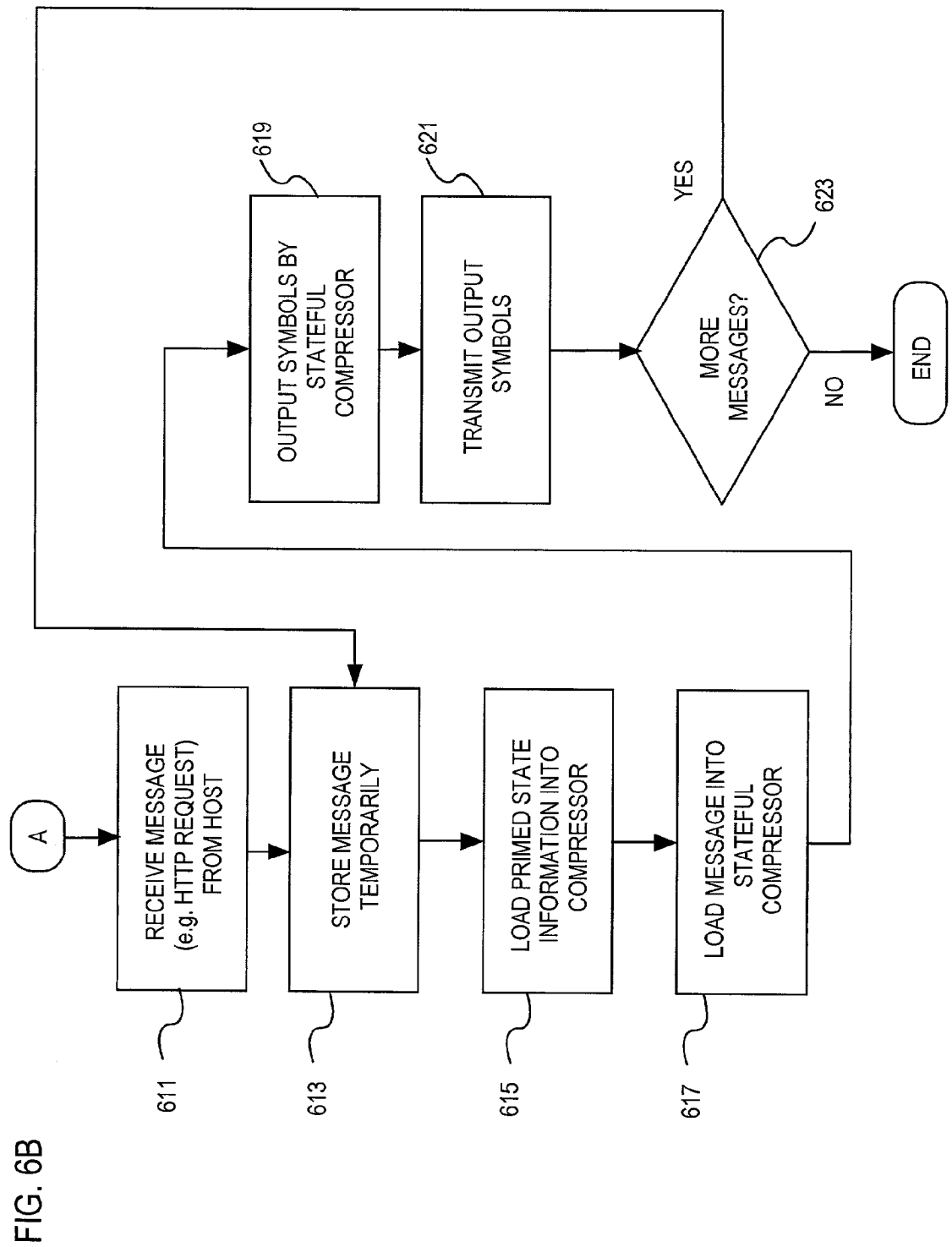

FIGS. 6A and 6B is a flow chart of a process for storing a compressor state and compressing messages, according to an embodiment of the present invention. In an exemplary embodiment, the stateful compressor 401 may avoid processing the priming sequence for each message. Accordingly, the "primed" state would be developed once and then stored, as shown in FIG. 6A. Specifically, in step 601, the stateful compressor 401 is initialized with the priming sequence. Next, the stateful compressor, as in step 603, outputs the symbols, in which the symbols corresponding to the priming sequence are discarded (per step 605). Thereafter, in step 607, the compressor state, as the primed state, is stored.

The above process of FIG. 6A may be conducted, for example, during the manufacturing stage, when operation commences, or any other time before messages are accepted for processing. After the compressor state is stored, the messages may be processed, according to the steps of FIG. 6B. When a message is received, as in step 611, the message is temporarily stored, per step 613. The primed state information is then loaded into the compressor 401, as in step 615. Thereafter, in step 617, the message is loaded in the stateful compressor 401, which outputs symbols (per step 619) that are transmitted (per step 621). Next, if more messages exist (per step 623), steps 613–621 are repeated.

The above stateless compression scheme advantageously provides sufficient compression to transmit the compressed message over a single or a small number of transmission slots on a communications channel of the satellite system 200. Under this arrangement, state information need not be maintained at each terminal, thereby greatly enhancing scalability. Also, the present invention does not require successful receipt of any earlier compressed messages in order to decompress any given compressed message. Further, compression gain of the first message is as good as for subsequent messages.

Figure 7:
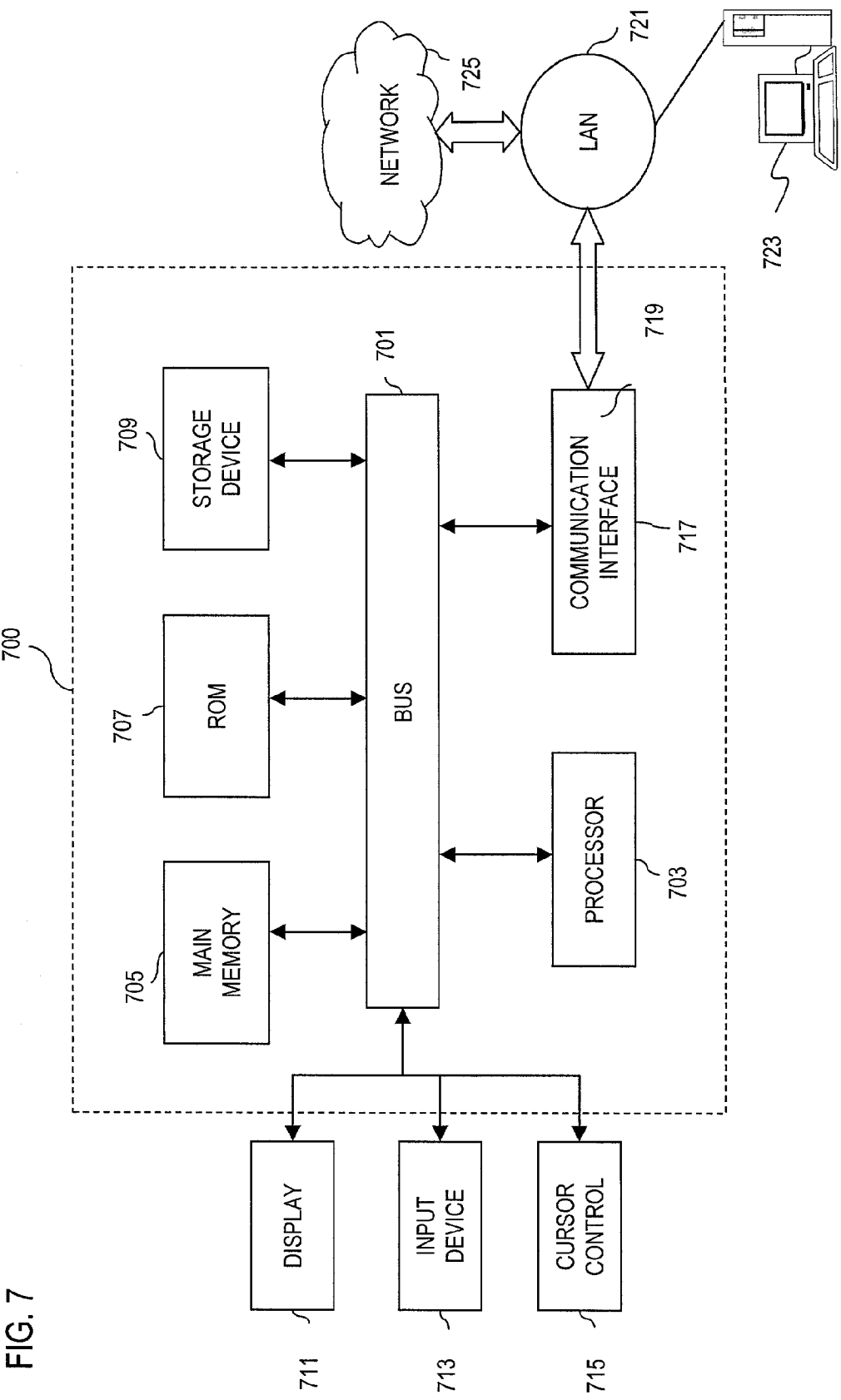
FIG. 7 is a diagram of a computer system that can perform stateless compression, in accordance with an embodiment of the present invention.

FIG. 7 shows a computer system 700 upon which an embodiment according to the present invention can be implemented. The computer system 700 includes a bus 701 or other communication mechanism for communicating information, and a processor 703 coupled to the bus 701 for processing information. The computer system 700 also includes main memory 705, such as a random access memory (RAM) or other dynamic storage device, coupled to the bus 701 for storing information and instructions to be executed by the processor 703. Main memory 705 can also be used for storing temporary variables or other intermediate information during execution of instructions to be executed by the processor 703. The computer system 700 further includes a read only memory (ROM) 707 or other static storage device coupled to the bus 701 for storing static information and instructions for the processor 703. A storage device 709, such as a magnetic disk or optical disk, is additionally coupled to the bus 701 for storing information and instructions.

The computer system 700 may be coupled via the bus 701 to a display 711, such as a cathode ray tube (CRT), liquid crystal display, active matrix display, or plasma display, for displaying information to a computer user. An input device 713, such as a keyboard including alphanumeric and other keys, is coupled to the bus 701 for communicating information and command selections to the processor 703. Another type of user input device is cursor control 715, such as a mouse, a trackball, or cursor direction keys for communicating direction information and command selections to the processor 703 and for controlling cursor movement on the display 711.

According to one embodiment of the invention, the stateless compression scheme is provided by the computer system 700 in response to the processor 703 executing an arrangement of instructions contained in main memory 705. Such instructions can be read into main memory 705 from another computer-readable medium, such as the storage device 709. Execution of the arrangement of instructions contained in main memory 705 causes the processor 703 to perform the process steps described herein. One or more processors in a multi-processing arrangement may also be employed to execute the instructions contained in main memory 705. In alternative embodiments, hard-wired circuitry may be used in place of or in combination with software instructions to implement the embodiment of the present invention. Thus, embodiments of the present invention are not limited to any specific combination of hardware circuitry and software.

The computer system 700 also includes a communication interface 717 coupled to bus 701. The communication interface 717 provides a two-way data communication coupling to a network link 719 connected to a local network 721. For example, the communication interface 717 may be a digital subscriber line (DSL) card or modem, an integrated services digital network (ISDN) card, a cable modem, or a telephone modem to provide a data communication connection to a corresponding type of telephone line. As another example, communication interface 717 may be a local area network (LAN) card (e.g. for Ethernet™ or an Asynchronous Transfer Model (ATM) network) to provide a data communication connection to a compatible LAN. Wireless links can also be implemented. In any such implementation, communication interface 717 sends and receives electrical, electromagnetic, or optical signals that carry digital data streams representing various types of information. Further, the communication interface 717 can include peripheral interface devices, such as a Universal Serial Bus (USB) interface, a PCMCIA (Personal Computer Memory Card International Association) interface, etc.

The network link 719 typically provides data communication through one or more networks to other data devices. For example, the network link 719 may provide a connection through local network 721 to a host computer 723, which has connectivity to a network 725 (e.g. a wide area network (WAN) or the global packet data communication network now commonly referred to as the "Internet") or to data equipment operated by service provider. The local network 721 and network 725 both use electrical, electromagnetic, or optical signals to convey information and instructions. The signals through the various networks and the signals on network link 719 and through communication interface 717, which communicate digital data with computer system 700, are exemplary forms of carrier waves bearing the information and instructions.

The computer system 700 can send messages and receive data, including program code, through the network(s), network link 719, and communication interface 717. In the Internet example, a server (not shown) might transmit requested code belonging an application program for implementing an embodiment of the present invention through the network 725, local network 721 and communication interface 717. The processor 704 may execute the transmitted code while being received and/or store the code in storage device 79, or other non-volatile storage for later execution. In this manner, computer system 700 may obtain application code in the form of a carrier wave.

The term "computer-readable medium" as used herein refers to any medium that participates in providing instructions to the processor 704 for execution. Such a medium may take many forms, including but not limited to non-volatile media, volatile media, and transmission media. Non-volatile media include, for example, optical or magnetic disks, such as storage device 709. Volatile media include dynamic memory, such as main memory 705. Transmission media include coaxial cables, copper wire and fiber optics, including the wires that comprise bus 701. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistant (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the present invention provides a stateless compression scheme to enhance network performance. A priming sequence is used to initialize a stateful compressor. Messages are compressed in a stateless fashion based upon the stored primed state established by the priming sequence. The present invention advantageously enhances efficient utilization of system resources, while improving scalability.

While the present invention has been described in connection with a number of embodiments and implementations, the present invention is not so limited but covers various obvious modifications and equivalent arrangements, which fall within the purview of the appended claims.

What is claimed is:

1. A method for providing stateless compression, the method comprising:
    receiving a message from a host;
    initializing a stateful compressor with a prescribed sequence to yield a primed state, wherein the message is input into the stateful compressor, the stateful compressor outputting a compressed message based upon the primed state;
    storing the primed state;
    receiving another message from the host;
    retrieving the stored primed state; and
    outputting another compressed message based upon the primed state.

2. A method according to claim 1, further comprising:
    transmitting The compressed message over a wide area network having meshed connectivity.

3. A method according to claim 1, further comprising:
    decompressing the compressed message based upon the primed state of the stateful compressor.

4. A method according to claim 1, wherein the prescribed sequence includes actual messages received from the host.

5. A method according to claim 1, wherein the message conforms with a communication protocol that supports delivery over the Internet.

6. A method for providing stateless compression, the method comprising:
    receiving a message from a host; and
    initializing a stateful compressor with a prescribed sequence to yield a primed state, wherein the message is input into the stateful compressor, the stateful compressor outputting a compressed message based upon the primed state,
    the compressed message being transmitted using a single transmission slot over a communication channel of a satellite network.

7. A network device for providing stateless compression, comprising:
    a communications interface configured to receive a message from a host;
    logic configured to perform stateful compression, wherein a primed state of the logic is set using a prescribed sequence, the logic outputting a compressed messaae based upon the primed state,
    the communications interface transmitting the compressed message using a single transmission slot over a communication channel of a satellite network.

8. A network device for providing stateless compression, comprising:
    a communications interface configured to receive a message from a host;
    logic configured to perform stateful compression, wherein a primed state of the logic is set using a prescribed sequence, the logic outputting a compressed message based upon the primed state; and
    memory coupled to the logic, the memory storina the primed state, the communications interface receiving another message from the host, wherein the logic outputs another comoressed message according to the stared primed state.

9. A device according to claim 8, wherein the communications interface interfaces with a wide area network having meshed connectivity.

10. A device according to claim 8. wherein the message conforms with a network protocol that supports delivery over the Intemet.

11. A device according to claim 8, wherein the prescribed sequence includes actual messages received from the host.

12. A communication system comprising:
    an originating network element configured to receive a message from a host and to perform stateless compression using a stateful compression scheme, wherein a primed state of the stateful compression scheme is set using a prescribed sequence, the network element outputting a compressed message based upon the primed state, wherein the compressed message is transmitted over a single transmission slot of one of a plurality time division multiple access (TDMA) channels supported by a satellite network; and
    a destination network element communicating with the originating network element over the satellite network, the destination network element being configured to decompress the compressed message.

13. A system according to claim 12, wherein the originating network element includes a memory for storing the primed state.

14. A system according to claim 12, wherein the message conforms with a network protocol that supports delivery over the Internet.

15. A system according to claim 12, wherein the prescribed sequence includes actual messages received from the host.

16. A network device for providing stateless compression, comprising:
    means for receiving a message from a host;
    means for initializing a stateful compressor with a prescribed sequence to yield a primed state, wherein the message is input into the statetul compressor, the stateful compressor outputting a compressed message based upon the primed state; and
    means for storing the primed state, wherein the receiving means receives another message from the host, the stored primed state being retrieved to output another compressed message.

17. A device according to claim 16, wherein the message conforms with a network protocol that supports delivery over the Internet.

18. A device according to claim 16, further comprising:
    means for decompressing the compressed message based upon the primed state of the stateful compressor.

19. A device according to claim 16, wherein the prescribed sequence includes actual messages received from the host.

20. A device according to claim 16, further comprising:
    means for transmitting the compressed message over a wide area network having meshed connectivity.

21. A network device for providing stateless compression, comprising:
  means for receiving a message from a host;
  means for initializing a stateful compressor with a prescribed sequence to yield a primed state, wherein the message is input into the stateful compressor, the stateful compressor outputting a comoressed message based upon the primed state,
  wherein the compressed message is transmitted using a single transmission slot over a communication channel of a satellite network.

22. A computer-readable medium carrying one or more sequences of one or more instructions for providing stateless compression, the one or more sequences of one or more instructions including instructions which, when executed by one or more processors, cause the one or more processors to perform the steps of:
  storing a message received from a host; and
  initializing a stateful compressor with a prescribed sequence to yield a primed state, wherein the message is input into the stateful compressor, the stateful compressor outputting a compressed message based upon the primed states;
  storing the primed state;
  storing another message received from the host;
  retrieving the stored orimed state; and
  outputting another compressed message based upon the primed state.

23. A computer-readable medium according to claim 22, wherein the one or more processors further perform the step of:
  initiating transmission of the compressed message over a wide area network having meshed connectivity.

24. A computer-readable medium according to claim 22, wherein the message conforms with a network protocol that supports delivery over the Internet.

25. A computer-readable medium according to claim 22, wherein the one or more processors further perform the step of:
  decompressing the compressed message based upon the primed state of the stateful compressor.

26. A computer-readable medium according to claim 22, wherein the prescribed sequence includes actual messages received from the host.

27. A computer-readable medium carrying one or more sequences of one or more instructions for providing stateless compression, the one or more sequences of one or more instructions including instructions which, when executed by one or more processors, cause the one or more processors to perform the steps of:
  storing a messaae received from a host;
  initializing a stateful compressor with a prescribed sequence to yield a primed state, wherein the message is input into the stateful compressor, the stateful compressor outputting a comoressed message based upon the primed state,
  wherein the compressed message is transmitted using a single transmission slot over a communication channel of a satellite network.

* * * * *